(12) United States Patent
Kalsekar et al.

(10) Patent No.: US 11,984,305 B2
(45) Date of Patent: May 14, 2024

(54) SUBSTRATE PEDESTAL FOR IMPROVED SUBSTRATE PROCESSING

(71) Applicant: Applied Materials, Inc., Santa Clara, CA (US)

(72) Inventors: Viren Kalsekar, Sunnyvale, CA (US); Vinay K. Prabhakar, Cupertino, CA (US); Venkata Sharat Chandra Parimi, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/092,421

(22) Filed: Jan. 2, 2023

(65) Prior Publication Data

US 2023/0147452 A1 May 11, 2023

Related U.S. Application Data

(62) Division of application No. 16/814,736, filed on Mar. 10, 2020, now Pat. No. 11,587,773.

(51) Int. Cl.
*H01J 37/32* (2006.01)
*H01L 21/683* (2006.01)

(52) U.S. Cl.
CPC .. *H01J 37/32724* (2013.01); *H01J 37/32174* (2013.01); *H01L 21/6833* (2013.01); *H01J 2237/24564* (2013.01)

(58) Field of Classification Search
CPC ....... H01J 2237/24564; H01J 37/32174; H01J 37/32724; H01L 21/67103; H01L 21/67248; H01L 21/6831; H01L 21/6833; H01L 21/68757; H01L 21/68792
See application file for complete search history.

(56) References Cited

U.S. PATENT DOCUMENTS

| | | | |
|---|---|---|---|
| 5,983,906 A | 11/1999 | Zhao et al. | |
| 6,189,482 B1 | 2/2001 | Zhao et al. | |
| 9,728,437 B2* | 8/2017 | Tran | H01L 21/67103 |
| 9,984,911 B2 | 5/2018 | Hanson et al. | |
| 2002/0050246 A1 | 5/2002 | Parkhe | |
| 2003/0169553 A1* | 9/2003 | Brown | H02N 13/00 361/234 |

(Continued)

FOREIGN PATENT DOCUMENTS

| | | |
|---|---|---|
| CN | 101584036 A | 11/2009 |
| CN | 101772837 A | 7/2010 |

(Continued)

OTHER PUBLICATIONS

Japanese Office Action dated Jan. 31, 2023 for Application No. 2021-568709.

(Continued)

*Primary Examiner* — Henry Luong
(74) *Attorney, Agent, or Firm* — Patterson + Sheridan, LLP

(57) ABSTRACT

A substrate pedestal includes a thermally conductive substrate support including a mesh, a thermally conductive shaft including a plurality of conductive rods therein, each conductive rod having a first end and a second end, and a sensor. The first end of each conductive rod is electrically coupled to the mesh, and the sensor is disposed between the first and second ends of each conductive rod and configured to detect current flow through each conductive rod.

20 Claims, 6 Drawing Sheets

(56) References Cited

U.S. PATENT DOCUMENTS

| | | |
|---|---|---|
| 2007/0221662 A1 | 9/2007 | Nishioka |
| 2009/0044750 A1 | 2/2009 | Pipitone |
| 2011/0005686 A1 | 1/2011 | Tanaka et al. |
| 2013/0284374 A1* | 10/2013 | Lubomirsky ..... H01L 21/67103 361/234 |
| 2015/0332894 A1 | 11/2015 | Valcore, Jr. et al. |
| 2017/0069520 A1 | 3/2017 | Unno |
| 2017/0306494 A1* | 10/2017 | Lin .................. H01J 37/32082 |
| 2017/0352567 A1* | 12/2017 | Cho ................. H01J 37/32724 |
| 2018/0358222 A1* | 12/2018 | Venkatasubramanian ................... G03F 7/70033 |

FOREIGN PATENT DOCUMENTS

| | | | |
|---|---|---|---|
| CN | 103650110 A | | 3/2014 |
| EP | 0855453 A1 | | 7/1998 |
| JP | H10312976 A | * | 11/1998 |
| JP | H10312976 A | | 11/1998 |
| JP | 2007258608 A | | 10/2007 |
| JP | 2010109316 A | | 5/2010 |
| JP | 2010238705 A | | 10/2010 |
| KR | 101651242 B1 | | 8/2016 |
| TW | 434698 B | | 5/2001 |
| WO | 2015198892 A1 | | 12/2015 |

OTHER PUBLICATIONS

International Search Report dated Jul. 6, 2020 for Application No. PCT/US2020/023000.
International Search Report and Written Opinion for Application No. 11202112207S dated Sep. 27, 2023.
Office Action dated Jan. 26, 2024 for Chinese Patent application 202080038428.9.
Taiwan Office Action dated Feb. 15, 2024 for Application No. 209116887.

* cited by examiner

SUBSTRATE PEDESTAL FOR IMPROVED SUBSTRATE PROCESSING

CROSS-REFERENCE TO RELATED APPLICATIONS

This application claims the benefit to U.S. Non Provisional application Ser. No. 16/814,736, filed Mar. 10, 2020, which is incorporated by reference herein.

BACKGROUND

Field

Embodiments described herein generally relate to semiconductor processing apparatuses that utilize high frequency power devices and, more particularly, to semiconductor processing apparatuses that utilize radio frequency (RF) power generation and/or delivery equipment.

Description of the Related Art

Semiconductor processing apparatuses typically include a process chamber that is adapted to perform various deposition, etching or thermal processing steps on a wafer, or substrate, within a processing region of the process chamber. To achieve higher deposition rates in a typical plasma-enhanced chemical vapor deposition (PECVD) chamber, plasma radial density is increased by the application of an increased radio frequency (RF) power. The RF power is delivered through a showerhead and a substrate pedestal, over which a wafer is disposed, from an RF generator The substrate pedestal includes a conductive mesh that is brazed to a conductive electrode.

However, due to an increased RF current induced by the increased RF power, large Joule heat is generated at a braze joint between the conductive mesh and the conductive electrode, resulting in localized heating at the braze joint and thus non-uniform temperature distribution over the wafer. Small variations in temperature in the wafer during processing can affect the within-wafer (WIW) uniformity of these often temperature dependent processes performed on the wafer.

Furthermore, a difference in thermal expansion coefficients of the conductive mesh and the conductive electrode generates thermal stress at an interface, causing a breakage of the substrate pedestal.

Accordingly, there is a need in the art to reduce the temperature variation across a wafer by improving the process of delivering RF power to a conductive mesh within a process chamber. Additionally, there is a need to reduce thermal stress at an interface between a conductive mesh and a conductive electrode.

SUMMARY

One or more embodiments described herein provide a substrate pedestal with an RF mesh connected to a single RF rod or multiple RF rods.

In one embodiment, a substrate pedestal includes a thermally conductive substrate support including a mesh, a thermally conductive shaft including a plurality of conductive rods therein, each conductive rod having a first end and a second end, and a sensor. The first end of each conductive rod is electrically coupled to the mesh, and the sensor is disposed between the first and second ends of each conductive rod and configured to detect current flow through each conductive rod.

In another embodiment, a substrate pedestal includes a thermally conductive substrate support including a mesh, a thermally conductive shaft including a braided rod therein. The braided rod includes a plurality of conductive rods, each conductive rod having a first end and a second end, and the plurality of conductive rods are braided along a length of the braided rod. The first end of each conductive rod is electrically coupled to the mesh.

In yet another embodiment, a substrate pedestal includes a thermally conductive substrate support including a mesh, a thermally conductive shaft including a conductive rod therein, the conductive rod being surrounded by an insulating layer and having a first end and a second end, and a braze joint that connects the mesh and the conductive rod. The braze joint includes a plurality of mesh adapter pieces, each mesh adapter piece having a third end and a fourth end, and a terminal having a fifth end and a sixth end, the third end of each mesh adapter piece is brazed to the mesh, the fourth end of each mesh adapter piece is brazed to the fifth end of the terminal, and the first end of the conductive rod is brazed to the sixth end of the terminal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to substrate pedestals that are adapted to perform high radio frequency (RF) power processes on a wafer, or substrate, disposed in a processing region of a semiconductor processing chamber. The substrate pedestal includes an RF powered mesh, which is disposed in a substrate supporting element, which is coupled to a RF rod or multiple rods that are adapted to deliver RF energy to the RF powered mesh.

The use of multiple RF rods, or a single RF rod that includes multiple braided conductive rods, in the substrate pedestal, allows for spatial distribution of RF current to the RF powered mesh from an RF generator. Thus, localized Joule heating at a braze joint between the RF rod(s) and the RF powered mesh is reduced and more uniform temperature distribution over a wafer, located on the substrate pedestal, can be achieved. Furthermore, the use of multiple mesh adapter pieces interfacing an RF rod and an RF powered mesh in the substrate pedestal reduces thermal stress at the interface, reducing occurrence of breakage of the substrate pedestal.

Figure 1:
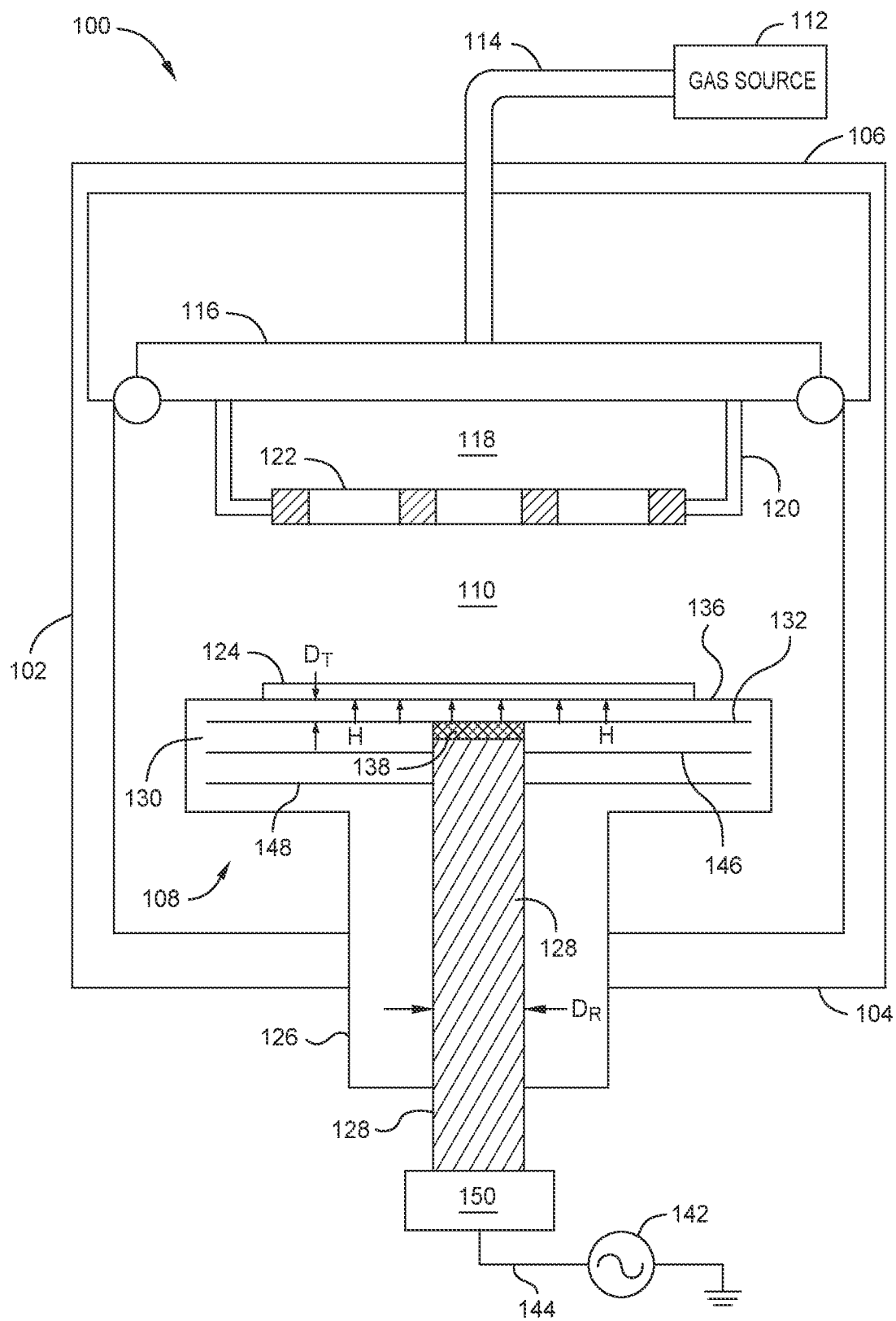
FIG. 1 is a side cross-sectional view of a processing chamber according to a first embodiment.

FIG. 1 is a side cross-sectional view of a processing chamber 100 according to a first embodiment. By way of example, the embodiment of the processing chamber 100 in FIG. 1 is described in terms of a plasma-enhanced chemical vapor deposition (PECVD) system, but any other type of processing chamber may be used, including other plasma deposition, plasma etching, or similar plasma processing chambers, without deviating from the basic scope provided herein. The processing chamber 100 includes walls 102, a bottom 104, and a chamber lid 106 that together enclose a substrate pedestal 108 and a processing region 110. The substrate pedestal 108 may be made of a dielectric material, such as a ceramic material (e.g., AlN, BN, or $Al_2O_3$ material). The walls 102 and bottom 104 of the processing chamber 100 may be made of an electrically and thermally conductive material, such as aluminum or stainless steel. As shown in FIG. 1, an RF generator 142 is coupled to the substrate pedestal 108.

As shown in FIG. 1, a gas source 112 is coupled to the processing chamber 100 via a gas tube 114 that passes through the chamber lid 106. As shown, the gas tube 114 is coupled to a backing plate 116 so that a processing gas may pass through the backing plate 116 and enter a plenum 118 formed between the backing plate 116 and a gas distribution showerhead 122. As shown in FIG. 1, the gas distribution showerhead 122 is held in place adjacent to the backing plate 116 by a suspension 120, so that the gas distribution showerhead 122, the backing plate 116, and the suspension 120 together form an assembly sometimes referred to as a showerhead assembly. During operation, processing gas introduced to the processing chamber 100 from the gas source 112 can fill the plenum 118 and pass through the gas distribution showerhead 122 to uniformly enter the processing region 110. In alternative embodiments, process gas may be introduced into processing region 110 via inlets and/or nozzles (not shown) that are attached to one or more of the walls 102 in addition to or in lieu of the gas distribution showerhead 122.

As shown, the substrate pedestal 108 includes a thermally conductive support 130 that has an RF powered mesh, hereafter mesh 132, embedded inside the thermally conductive support 130. The thermally conductive support 130 also includes a single electrically conductive rod (referred to as an "RF rod") 128 disposed within at least a portion of a conductive shaft 126 that is coupled to the thermally conductive support 130. A substrate 124 (or wafer) may be positioned on top of the thermally conductive support 130 during processing. In some embodiments, the RF generator 142 is coupled to the RF rod 128 via one or more transmission lines 144 (one shown). In some embodiments, the RF generator 142 provides an RF current to the mesh 132 at a frequency of between about 200 kHz and about 81 MHz, such as between about 13.56 MHz and about 40 MHz. The power generated by the RF generator 142 acts to energize (or "excite") the gas in the processing region 110 into a plasma state to, for example, form a layer on a surface of the substrate 124 during a plasma deposition process. In one embodiment, the RF rod 128 is brazed to the mesh 132 via a braze joint 138. The RF rod 128 may be made of nickel (Ni) and the mesh 132 may be made of molybdenum (Mo). As thermal expansion coefficients of nickel (Ni) and molybdenum (Mo) are similar (13 µm/(m·K) for Ni and 5 µm/(m·K) for Mo at 25° C.), a break of the braze joint 138 due to thermal stress can be prevented with this selection of materials for the RF rod 128 and the mesh 132. In other embodiments, the mesh 132 is made of other refractory metal such as tungsten (W). In some embodiments, the RF rod 128 is coupled to the mesh 132 by other joining methods. In some embodiments, an RF filter 150 is provided between the RF rod 128 and the RF generator 142. The RF filter 150 is generally either one or more low-pass filters or band-stop filters that are configured to block RF energy from reaching the RF generator 142.

As shown in FIG. 1, embedded within the thermally conductive support 130 is the mesh 132, an optional biasing electrode 146, and a heating element 148. The biasing electrode 146 can act to separately provide an RF "bias" to the substrate and processing region 110 through a separate RF connection (not shown). The heating element 148 may include one or more resistive heating elements that are configured to provide heat to the substrate 124 during processing by the delivery of AC power therethrough. The biasing electrode 146 and the heating element 148 can be made of conductive materials such as molybdenum (Mo), tungsten (W), or other similar materials.

The mesh 132 can also act as an electrostatic chucking electrode, which helps to provide a proper holding force to the substrate 124 against a supporting surface 136 of the thermally conductive support 130 during processing. In some embodiments, the mesh 132 is embedded at a distance DT (shown FIG. 1) from the supporting surface 136, on which the substrate 124 sits. The distance DT may be very small, such as less than 1 mm. Therefore, variations in temperature across the mesh 132 greatly influence the variations in temperature of the substrate 124 disposed on the supporting surface 136. The heat transferred from the mesh 132 to the supporting surface 136 is represented by the H arrows in FIG. 1.

Therefore, spreading out, dividing, or distributing the amount of RF current provided to the mesh 132, and thus minimizing the added temperature increase created at the mesh 132 junctions results in more uniform temperature distribution across the mesh 132. A uniform temperature distribution across the mesh 132 creates a uniform temperature distribution across the supporting surface 136 and the substrate 124.

One skilled in the art will appreciate that RF energy is primarily conducted through a surface region of a conductive element, and thus generally the current carrying area of an RF conductor is primarily governed by the surface area of the RF conducting element. The current carrying area of an RF conductor is reduced as the frequency of the delivered RF power increases, due to a decrease in the skin depth the delivered RF power is able to penetrate into the RF conductor as the RF power is delivered through the RF conductor. For example, in an RF rod that has a circular cross-sectional shape and an outer diameter $D_o$, the RF current carrying area between its skin depth and surface (Aca) is equal to the cross-section area ($A_o = \pi \cdot D_o^2/4$) minus the current carrying area beyond its skin depth ($A_{na} = \pi \cdot D_{na}^2/4$), where $D_{na}$ is the diameter of the area below its skin depth (i.e., $D_{na} = D_o - 2 \cdot \delta$, where $\delta$ is the skin depth). That is, the RF current carrying area is $A_o - A_{na} = \pi \cdot (D_o^2/4 - D_{na}^2/4) = \pi \cdot (D_o - \delta)\delta$. Skin depth can be approximated by the equation $\delta = (\rho/(\pi f \mu_r \mu_o))^{0.5}$, where $\rho$ is the resistivity of the medium in $\Omega \cdot m$, f is the driven frequency in Hertz (Hz), $\mu_r$ is the relative permittivity of the material, and $\mu_o$ is the permittivity of free space. Skin depth refers to the point in which the current density reaches approximately 1/e (about 37%) of its value at the surface of the medium. Therefore, the majority of the current in a medium flows between the surface of the medium and its skin depth. Thus, a single RF rod 128 having a larger diameter $D_o$ and a larger skin depth $\delta$ distributes the amount of RF current provided to the mesh 132 in a larger current carrying area, and thus reduces localized heating at the braze joint 138. In one example, the skin depth for a pure nickel (Ni) material is approximately 1.5 μm and for a pure gold (Au) approximately 20 μm at a frequency of 13.56 MHz, thus a single RF rod 128 made of gold (Au) has a larger RF current carrying area (due to a larger skin depth $\delta$). However, a thermal expansion coefficient of gold (Au) (14.2 μm/(m·K) for Mo and 4.5 μm/(m·K) for W at 25° C.) has a large discrepancy from the thermal expansion coefficients of the material of the braze joint 138 (5 μm/(m·K) for Mo and 4.5 μm/(m·K) for W at 25° C.), and thus the braze joint 138 may not withstand thermal stress, leading to susceptibility for breakages. Therefore, a single RF rod 128 made of nickel (Ni) that has a smaller thermal expansion coefficient (13 μm/(m·K) at 25° C.) may be robust against a breakage caused by thermal stress.

Figure 2:
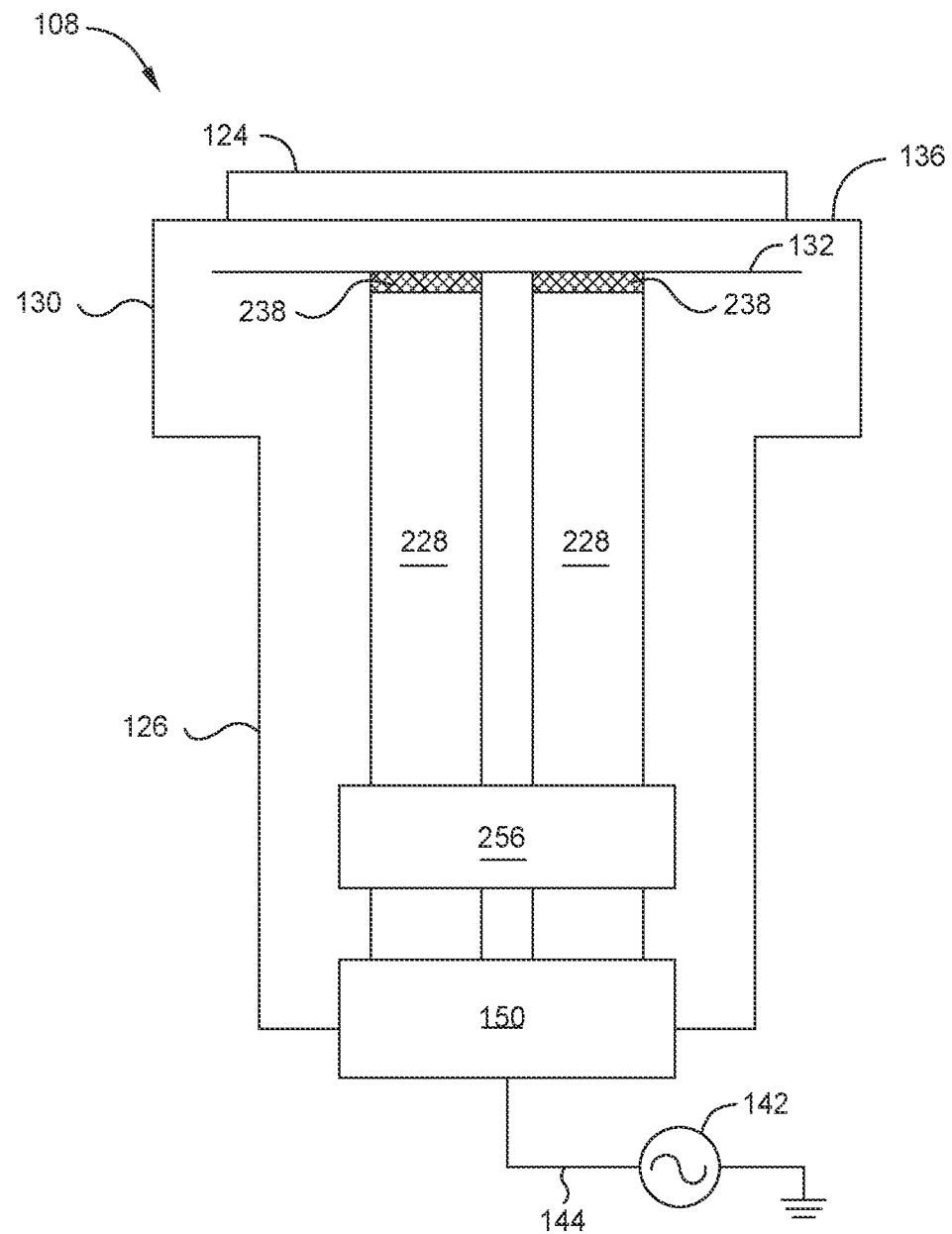
FIG. 2 is a partial side cross-sectional view of a substrate pedestal according to a second embodiment.

FIG. 2 is a partial side cross-sectional view of the substrate pedestal 108, according to a second embodiment. In the second embodiment, the single RF rod 128 according to the first embodiment is replaced with dual RF rods 228. The same reference numerals are used for the components that are substantially the same as those of the first embodiment, and the description of repeated components may be omitted. In FIG. 2, the dual RF rods 228 are brazed to the mesh 132 at braze joints 238. The dual RF rod 228 may be made of nickel(Ni). In some embodiments, the dual RF rods 228 may be coupled to the mesh 132 by other joining methods. The dual RF rods 228 divide the RF current provided by the RF generator 142 to the mesh 132 into two RF rods and thus reduces the Joule heating (e.g., $I^2R$ heating) at each of the dual RF rods 228, resulting in a more uniform temperature distribution across the thermally conductive support 130, which translates into, for example, a more uniformly deposited film layer formed across the substrate 124.

In some embodiments, a health check circuit 256 may be inserted on an RF current path of each of the dual RF rods 228 between the mesh 132 and the one or more transmission lines 144. The health check circuit 256 may be a sensor, such as a voltage/current (V/I) sensor: for use in detecting the current flow through each of the dual RF rods 228 in order to detect any damage/degradation to either of the dual RF rods 228. Such early detection of damage/degradation can be used to identify issues so that the substrate pedestal 108 can be repaired by re-brazing the RF rods 228 before any catastrophic failures occur.

The dual RF rods 228 may replace the single RF rod 128 in the processing chamber 100 according to the first embodiment with a few or no modification to the RF filter 150. In some embodiments, the dual RF rods 228 may be combined using an RF strap (not shown) that is connected to the RF filter 150. This configuration requires no modification to the RF filter 150 designed for a single RF rod 128. In some embodiments, one or more RF straps (not shown) may be disposed between the braze joints 238 and the RF filter 150 to compensate for expansions of the RF rods.

In the example embodiment described above, dual RF rods 228 are described and shown FIG. 2. However, any number of multiple RF rods may be used, including three or more. Current through each RF rod can thus be half (or less) of the current through the single RF rod 128. Accordingly, current flows into the braze joints 138 at a lower magnitude and at multiple distributed points across the mesh 132, helping to spread the amount of heat generated across the substrate 124, creating much less of a heat increase at any one point. Spreading of the generated heat across the substrate 124 acts to improve the uniformity in the film layer deposited on the substrate 124. As shown, each of the braze joints 138 can be spread relatively far apart from each other, widely distributing the current and the generated heat across the supporting surface 136, resulting in a more uniform heat spread across the substrate 124.

Figure 3A:
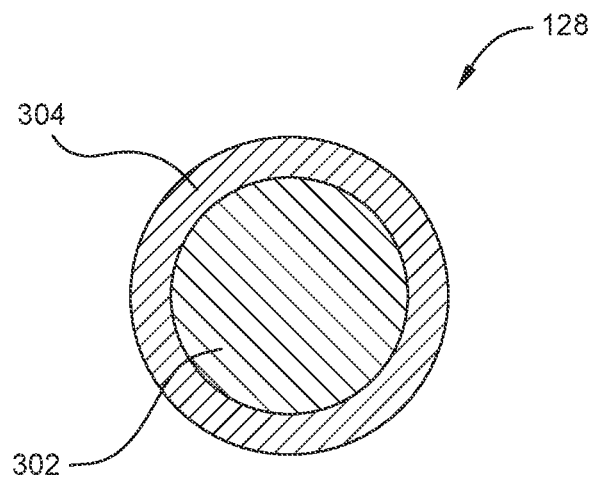
FIGS. 3A and 3B are cross sectional views of a single RF rod according to the first embodiment and a braided RF rod according to a third embodiment.
Figure 3B:
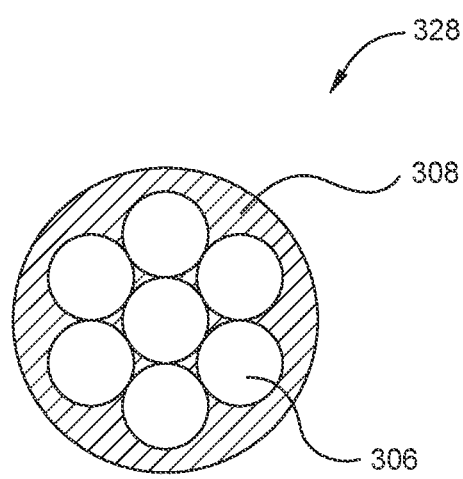

FIGS. 3A and 3B are cross sectional views of the single RF rod 128 according to the first embodiment and a braided RF rod 328 according to a third embodiment. In FIG. 3A, the single RF rod 128 includes one conductive rod 302 surrounded by an insulation layer 304. In FIG. 3B, multiple conductive rods 306 (7 conductive rods are shown) are braided along a length of the braided RF rod 328 and surrounded by an insulation layer 308. In the braided RF rod 328, the sum of the current carrying areas between the surfaces and skin depths of all of the conductive rods 306 combined is larger than the current carrying area between the surface and skin depth of the single RF rod 128. This provides the advantage of creating a larger area to conduct the majority of RF energy between the braided RF rod 328 and the mesh 132, which reduces the heat generated at the braze joints 138 and also within the braided RF rod 328 versus a conventional single RF rod configuration shown in FIG. 3A, due to Joule heating. For example, a single RF rod 128, having an outer diameter $D_R$ of 6 mm and skin depth $\delta$ of approximately 1.46 μm, has a current carrying area $A_{ca1} = \pi \cdot (D_R - \delta) \delta$ of approximately $2.8 \times 10^{-2}$ mm$^2$. Comparatively, each of the conductive rods 306 having an outer diameter $D_C$ of 2 mm has a current carrying area $A_{ca2} = \pi \cdot (D_C - \delta) \delta$ of approximately $0.9 \times 10^{-3}$ mm$^2$. Thus, for a braided RF rod 328 having seven conductive rods 306, the ratio of the total current carrying area to the current carrying area of the single RF rod 128 (i.e., $7 \times A_{ca2}/A_{ca1} = 7 \times (D_C - \delta)/(D_R - \delta)$) is about 2.3. Therefore, in the embodiment shown in FIG. 3B, the current is distributed over a larger current carrying area, generating less Joule heating at each of the braze joints 138 in the braided RF rod 328 than at the single RF rod 128 shown in FIG. 3A.

The braided RF rod 328 disclosed herein also provides an advantage over a conventional single RF rod since each of the conductive rods 306, having a smaller diameter, has a smaller cross-sectional area and thus a smaller contact area at each of the braze joints 138. The smaller cross-sectional area of the conductive rod 306 reduces the ability of each of the conductive rods 306 to thermally conduct any heat generated in the conductive rods 306 due to the delivery of the RF power therethrough. The reduced ability to conduct heat also spreads the heat more uniformly within the conductive support 130, helping to create a more uniform temperature distribution across the supporting surface 136 and substrate 124. Following the prior example above, where the outer diameter $D_R$ of the single RF rod 128 is equal to 6 mm and the outer diameter $D_C$ of each of the conductive rods 306 is equal to 2 mm, the ratio of the thermal conduction areas of the braided RF rod 328 having seven conductive rods 306 to the single RF rod 128 area will be about 0.78.

Figure 4A:
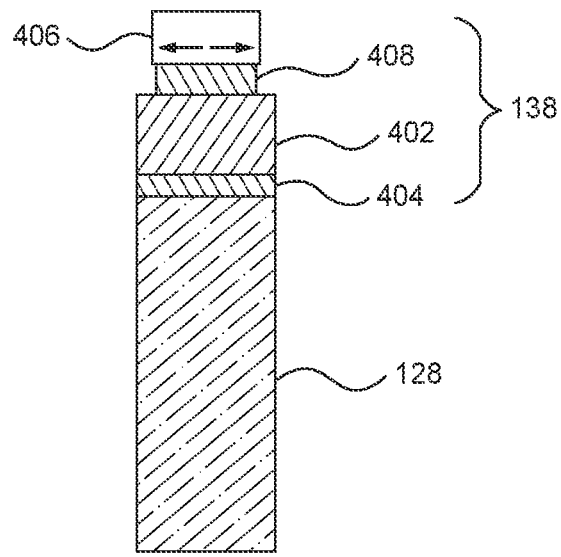
FIGS. 4A and 4B are partial cross-sectional views of a substrate pedestal according to embodiments of the present disclosure.

FIG. 4A is a partial cross-sectional view of the substrate pedestal 108 according to one embodiment. In the embodiment shown, the braze joint 138 includes a terminal 402 and braze portions 404 and 408. The RF rod 128, having a large diameter between about 5 mm and about 12 mm, is brazed to the terminal 402 at the braze portion 404. The terminal 402 may be made of a ferromagnetic metal, such as iron (Fe), cobalt (Co), nickel (Ni), or other similar materials. In one embodiment, the terminal 402 is a Kovar® Ni—Fe alloy. The terminal 402 is further brazed to an RF terminal 406 (also referred to as an "adapter") at the braze portion 408. The RF terminal 406 is brazed to the mesh 132 (shown in FIG. 1) disposed within the substrate pedestal 108. In one embodiment, the substrate pedestal 108 is made of a ceramic material at temperatures exceeding 1000° C.; thus, the RF terminal 406 may be made of the same refractory metal (i.e., resistant to heat and wear) as the mesh 132, such as molybdenum (Mo), tungsten (W), or other similar materials. The braze portions 404 and 408 may include one or more transition metals, such as nickel (Ni), or other similar materials. As thermal expansion coefficients of the material that terminal 402 (e.g., 5 μm(m·K) for Mo and 4.5 μm/(m·K) for W at 25° C.) and the material that the RF terminal 406 and the mesh 132 (e.g., 12 μm/(m·K) for Fe, 16 μm/(m·K) for Co,13 μm/(m·K) for Ni at 25° C.) have a large discrepancy, the braze portion 408 is susceptible to stress in the directions indicated by the arrows in FIG. 4A, especially at elevated temperatures such as above 500° C., leading to susceptibility for breakages. The magnitude of such stress depends on the size of an interface between the terminal 402 and the RF terminal 406. A larger area of the interface (e.g., due to a large diameter of the RF rod 128, such as between about 5 mm and about 12 mm) introduces higher stress at the interface. Specifically, a length L of an area at the interface increases L=L+αLΔT as the temperature rises by ΔT in the area at the interface, where a is the thermal expansion coefficient.

Figure 4B:
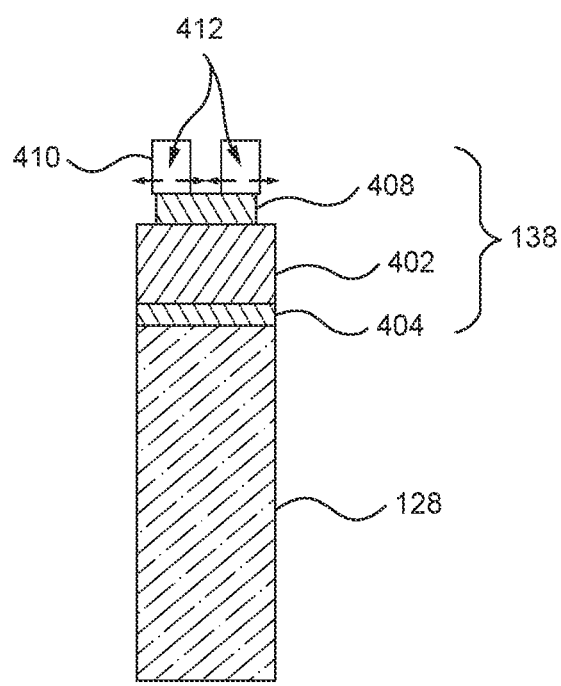

FIG. 4B is a partial cross-sectional view of the substrate pedestal 108 according to one embodiment, in which the RF terminal (adapter) 406 shown in FIG. 4A is replaced by an RF terminal (adapter) 410 that includes multiple pieces (also referred to as "mesh adapter pieces") 412. While a total cross-sectional area of the multiple pieces 412 is kept equal to the cross-sectional area of the RF terminal 406, each of the multiple pieces 412 has a smaller diameter than the RF terminal 406. Thus, the RF terminal 410 having smaller diameter multiple pieces 412 reduces the local stress induced due to the difference in the thermal expansion coefficients.

Figure 5:
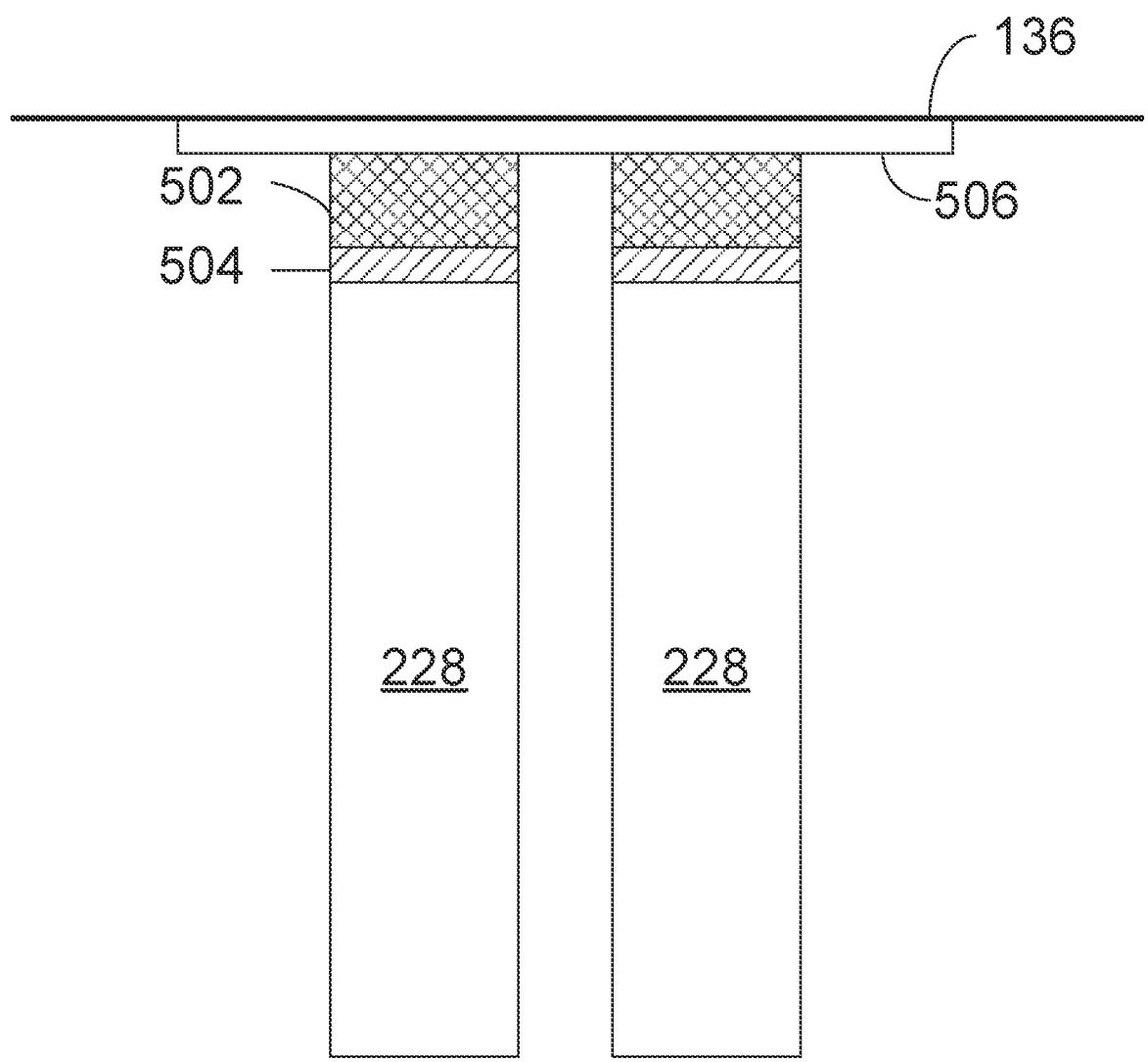
FIG. 5 is a partial cross-sectional view of a substrate pedestal according to one embodiment.

FIG. 5 is a partial cross-sectional view of the substrate pedestal 108 according to one embodiment. In the embodiment shown, the braze joint 238 includes terminals 502 and braze portions 504. The multiple RF rods 228, which has multiple individual rods circularly arranged, are brazed to the terminals 502 at the braze portions 504. The terminals 502 may be made of a ferromagnetic metal, such as iron (Fe), cobalt (Co), nickel (Ni), or other similar materials. In one embodiment, the terminal 502 is a Kovar® Ni—Fe alloy. The terminals 502 are further connected to a tube 506 that replaces the adapters (the RF terminal 406 in FIG. 4A and the RF terminal in FIG. 4B). The tube (adapter) 506 has a hollow ring shape with a large diameter in a plane perpendicular to the length of the multiple RF rods 228. The tube 506 is connected to all individual RF rods in the multiple RF rod 228, and may be made of a ferromagnetic metal, such as nickel (Ni), or other similar materials. Since the tube 506 is hollow, the tube 506 can bend and absorb stress caused by thermal expansion of the multiple RF rods 228.

Due to the hollowness and a large diameter, a surface area of the tube 506 can be significantly increased as compared with a solid tube having a smaller diameter. For example, a solid tube with a diameter $D_{ST}$ of 5 mm (which is approximately a diameter of a typical RF rod currently used), a perimeter of the solid tube is $\pi D_{ST}$ ~15.7 mm. For a hollow tube with a diameter $D_{HT}$ of 45 mm and thickness t of 2 mm, a total perimeter (a sum of an outer perimeter and an inner perimeter of the hollow tube) is $\pi \cdot D_{HT} + \pi \cdot (D_{HT}-t)$ ~276 mm. Thus, a surface area of the hollow tube is about 17 times larger than the solid tube. This increased surface area reduces localized heating in the tube 506.

Figure 6:
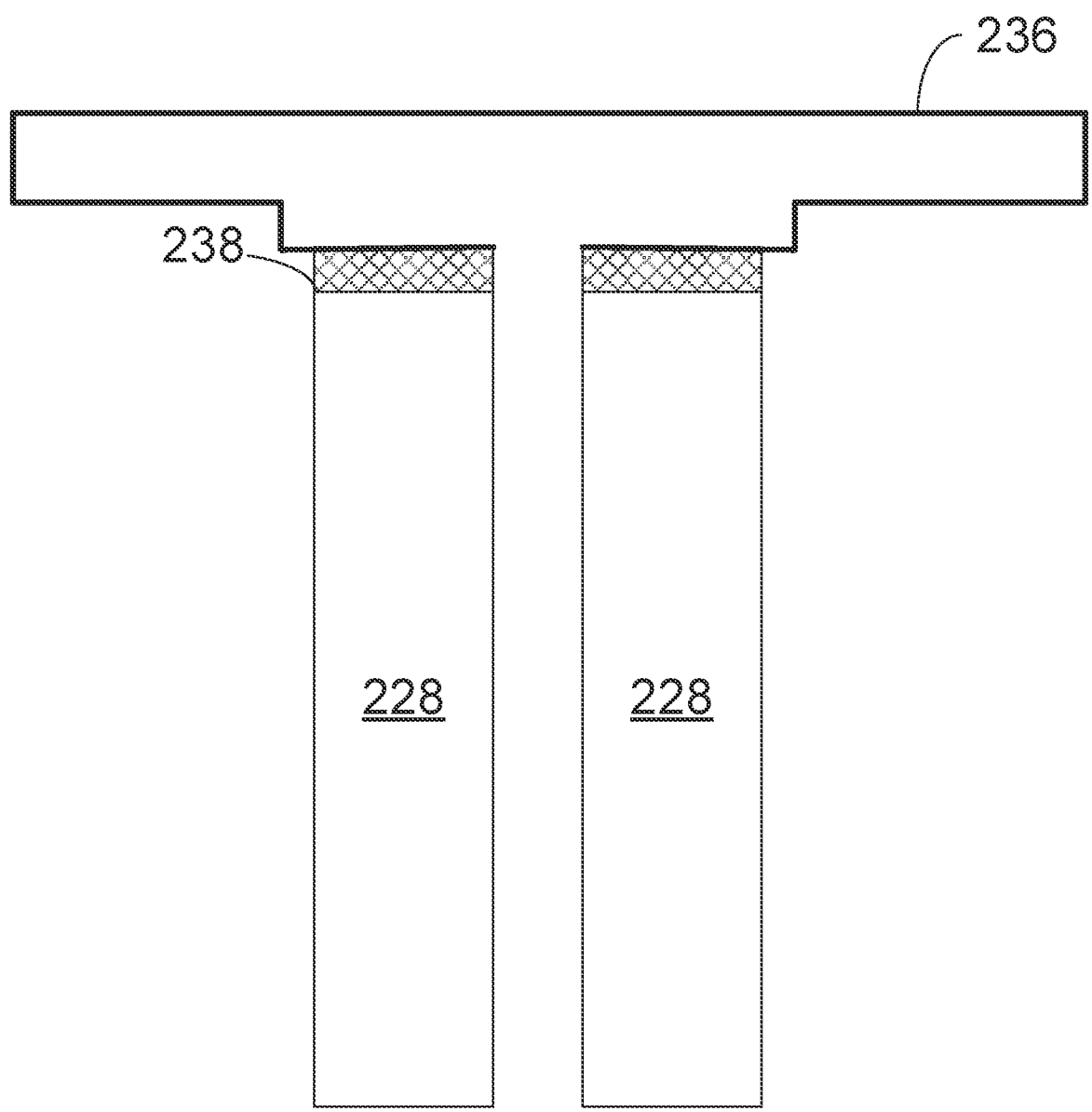
FIG. 6 is a partial cross-sectional view of a substrate pedestal according to one embodiment.

FIG. 6 is a partial cross-sectional view of the substrate pedestal 108 according to one embodiment, in which the one-level mesh 132 shown in FIG. 2 is replaced by a two-level mesh 632. The structure of the two-level mesh 632 reduces heat generation at positions of the braze joints 238 on the substrate 124 (referred to as RF hotspots). Specifically, the structure of the two level-mesh 632 helps moving the hotspots down within the substrate pedestal 108, and thus reducing the hotspots on the substrate 124.

In the example embodiments described herein, substrate pedestals that are adapted to perform high radio frequency (RF) power processes on a wafer, or substrate, disposed in a processing region of a semiconductor processing chamber include multiple RF rods or multiple braided conductive rods, such that RF current to a RF powered mesh via the multiple RF rods or multiple braided conductive rods provided by an RF generator is spatially distributed. Thus, localized Joule heating at a braze joint between the multiple RF rods or multiple braided conductive rods and the RF powered mesh is reduced and more uniform temperature distribution over a wafer, located on the substrate pedestal, can be achieved. Furthermore, the use of multiple mesh adapter pieces interfacing an RF rod and an RF powered mesh in the substrate pedestal reduces thermal stress at the interface, reducing occurrence of breakage of the substrate pedestal.

While the foregoing is directed to embodiments of the present disclosure, other and further embodiments of the disclosure may be devised without departing from the basic scope thereof, and the scope thereof is determined by the claims that follow.

The invention claimed is:
1. A substrate pedestal, comprising:
   a thermally conductive substrate support comprising a mesh;
   a thermally conductive shaft comprising a plurality of conductive rods braided together, each conductive rod having a first end and a second end; and
   a sensor, wherein the first end of said each conductive rod is electrically coupled to the mesh, and the sensor is disposed between the first and second ends of said each conductive rod and configured to detect current flow through said each conductive rod.

2. The substrate pedestal of claim 1, wherein the conductive rods are surrounded by an insulating layer.

3. The substrate pedestal of claim 1, further comprising:
an RF filter connected to the second end of said each conductive rod; and
an RF generator that is coupled to the RF filter.

4. The substrate pedestal of claim 3, wherein the RF generator provides an RF current at a frequency about 13.56 MHz.

5. The substrate pedestal of claim 1, wherein:
the plurality of braided conductive rods comprises nickel,
the mesh comprises molybdenum, and
the plurality of conductive rods are brazed to the mesh.

6. The substrate pedestal of claim 1, wherein the sensor is a voltage/current (V/I) sensor.

7. The substrate pedestal of claim 1, wherein the mesh is a one-level mesh.

8. The substrate pedestal of claim 1, wherein the mesh is a two-level mesh.

9. The substrate pedestal of claim 1, wherein the plurality of conductive rods comprises seven rods.

10. A substrate pedestal, comprising:
a thermally conductive substrate support comprising a mesh;
a thermally conductive shaft comprising:
a plurality of conductive rods, each conductive rod having a first end and a second end; and
the plurality of conductive rods are braided together, and
the first end of said each conductive rod is electrically coupled to the mesh.

11. The substrate pedestal of claim 10, wherein the plurality of conductive rods is surrounded by an insulating layer.

12. The substrate pedestal of claim 10, further comprising:
an RF filter connected to the second end of said each conductive rod; and
an RF generator that is coupled to the RF filter.

13. The substrate pedestal of claim 12, wherein the RF generator provides an RF current at a frequency about 13.56 MHz.

14. The substrate pedestal of claim 10, wherein:
the plurality of conductive rods comprises nickel,
the mesh comprises molybdenum, and
the plurality of conductive rods are brazed to the mesh.

15. The substrate pedestal of claim 10, wherein the mesh is a one-level mesh.

16. The substrate pedestal of claim 10, wherein the mesh is a two-level mesh.

17. A substrate pedestal, comprising:
a thermally conductive substrate support comprising a mesh;
a thermally conductive shaft comprising a plurality of conductive rods braided to form a braided together rod surrounded by an insulating layer and having a first end and a second end; and
a first braze joint connecting the mesh and a first conductive rod of the braided rod, the first braze joint comprising:
a first adapter having a third end and a fourth end, the first adapter comprising a hollow tube disposed beneath the mesh; and
a first terminal having a fifth end and a sixth end, wherein,
the third end of the first adapter is brazed to the mesh,
the fourth end of the first adapter is brazed to the fifth end of the first terminal, and
the first end of the braided rod is brazed to the sixth end of the first terminal.

18. The substrate pedestal of claim 17, wherein the braided rod comprises seven conductive rods.

19. The substrate pedestal of claim 17, wherein the mesh is a two-level mesh.

20. The substrate pedestal of claim 17, further comprising a sensor disposed between the first and second ends of the first conductive rod of the braided rod and configured to detect current flow through each of the conductive rods of the braided rod.

* * * * *